(12) United States Patent
Gicquel et al.

(10) Patent No.: US 8,274,419 B2
(45) Date of Patent: Sep. 25, 2012

(54) ANALOG-DIGITAL CONVERTER WITH PIPELINE ARCHITECTURE ASSOCIATED WITH A PROGRAMMABLE GAIN AMPLIFIER

(75) Inventors: Hugo Gicquel, Grenoble (FR); Sophie Minot, Grenoble (FR); Marc Sabut, Eybens (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 12/702,970

(22) Filed: Feb. 9, 2010

(65) Prior Publication Data

US 2010/0225509 A1    Sep. 9, 2010

(30) Foreign Application Priority Data

Feb. 10, 2009  (FR) ...................................... 09 50802

(51) Int. Cl.
*H03M 1/42* (2006.01)
(52) U.S. Cl. ........ 341/161; 341/118; 341/120; 341/155; 341/172
(58) Field of Classification Search .................. 341/118, 341/120, 155, 161
See application file for complete search history.

(56) References Cited

U.S. PATENT DOCUMENTS

| | | | | |
|---|---|---|---|---|
| 5,534,864 A * | 7/1996 | Ono et al. | ...................... | 341/156 |
| 6,486,820 B1 * | 11/2002 | Allworth et al. | .............. | 341/161 |
| 6,489,904 B1 * | 12/2002 | Hisano | .......................... | 341/120 |
| 6,590,517 B1 | 7/2003 | Swanson | ........................ | 341/155 |
| 6,642,871 B2 * | 11/2003 | Takeyabu et al. | .............. | 341/120 |
| 7,142,138 B2 * | 11/2006 | Chen et al. | ..................... | 341/120 |
| 7,265,703 B2 * | 9/2007 | Sasaki et al. | ................... | 341/161 |
| 7,295,645 B1 | 11/2007 | El-Ghoroury et al. | ......... | 375/395 |
| 7,786,910 B2 * | 8/2010 | Ali et al. | ......................... | 341/131 |
| 7,830,288 B2 * | 11/2010 | Patterson et al. | ............. | 341/136 |
| 7,855,671 B2 * | 12/2010 | Dura et al. | ..................... | 341/155 |
| 7,880,659 B2 * | 2/2011 | Lee | ................................ | 341/161 |
| 7,924,204 B2 * | 4/2011 | Chang et al. | ................... | 341/161 |
| 2005/0062635 A1 | 3/2005 | Franz | ............................. | 341/161 |
| 2005/0219097 A1 * | 10/2005 | Atriss et al. | ................... | 341/144 |
| 2008/0198055 A1 * | 8/2008 | Matsubayashi | ............... | 341/155 |

OTHER PUBLICATIONS

Kang et al., "Multiple integration method for a high signal-to-noise ratio readout integrated circuit", IEEE Transactions on Circuits and Systems-II: Express briefs, vol. 52, No. 9, Sep. 2005, pp. 553-557.
Luo et al., "A high linearity analog front end for multiprocessor SOC integration", System-on-Chip, Proceedings, Nov. 2004, pp. 9-12.

* cited by examiner

*Primary Examiner* — Linh Nguyen
(74) *Attorney, Agent, or Firm* — Allen, Dyer, Doppelt, Milbrath & Gilchrist, P.A.

(57) ABSTRACT

A device may include a programmable gain amplifier and an analog-digital converter with pipeline architecture having several stages. The first stage of the analog-digital converter may incorporate the programmable gain amplifier and an analog-digital conversion circuit with a programmable threshold.

26 Claims, 6 Drawing Sheets

ANALOG-DIGITAL CONVERTER WITH PIPELINE ARCHITECTURE ASSOCIATED WITH A PROGRAMMABLE GAIN AMPLIFIER

FIELD OF THE INVENTION

The invention relates to the conversion of signals and, more particularly, to analog-digital converters with a pipeline architecture associated with a programmable gain amplifier.

BACKGROUND OF THE INVENTION

Figure 1:
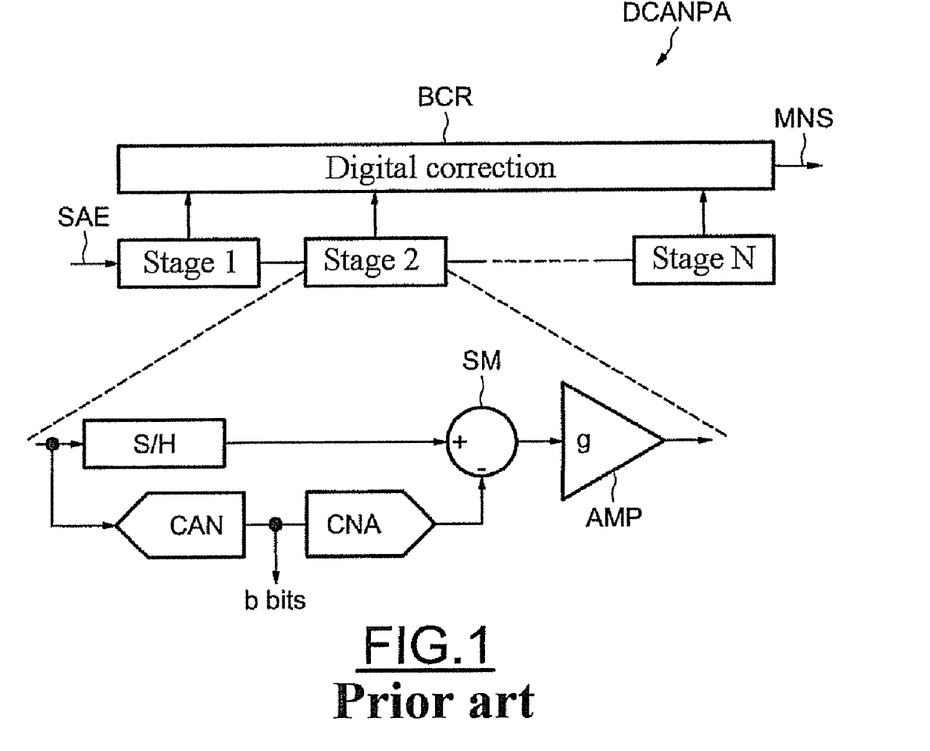
FIGS. 1 and 2, are schematic diagrams of circuits, according to the prior art.

As shown schematically in FIG. 1, an analog-digital converter with a pipeline architecture DCANPA comprises several stages (in this instance N stages), each of which usually has a fairly low resolution (from 1 to 3 bits in general). The first stage receives an analog signal SAE and the converter DCANPA delivers at the output a corresponding digital word MNS. Each of the stages has a sample-and-hold (sample-and-hold) S/H in order to sample the signal originating from the previous stage, a signal commonly referred to by those skilled in the art as the "residue."

Each stage moreover comprises an analog-digital conversion circuit CAN delivering b bits and followed by a digital-analog conversion circuit. The output of the digital-analog converter CNA is subtracted from the signal originating from the sample-and-hold S/H and then amplified in an amplifier AMP with a fixed gain g.

The b bits of each stage undergo digital correction in a block BCR to form the output digital word MNS. This type of pipeline-architecture converter notably has the advantage of having a sampling speed that is independent of the number of stages used and a good tolerance with respect to the offsets of the comparators of the circuits CAN.

Figure 2:
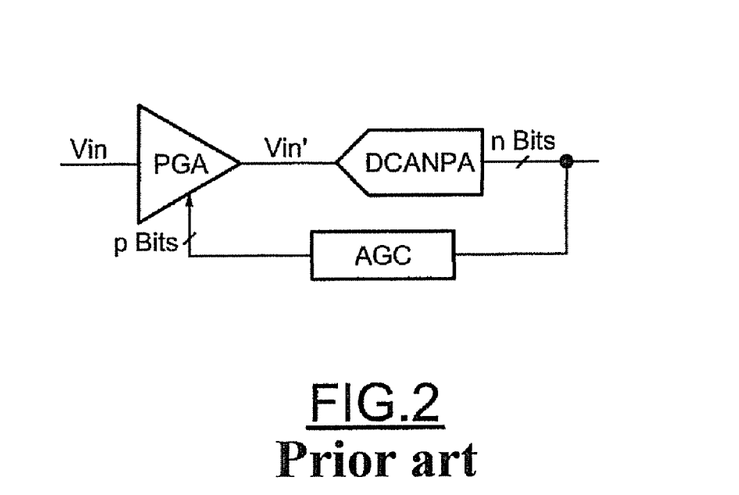

In data-conversion systems, this type of analog-digital converter is usually associated with a programmable gain amplifier PGA, placed in front of the input of the analog-digital converter, which makes it possible to adjust the amplitude of the input analog signal, voltage Vin, for example, as illustrated in FIG. 2. The programmable gain amplifier PGA is, for example, controlled by automatic gain control means or a typical automatic gain controller AGC.

A potential drawback of such an implementation lies in the fact that the programmable gain amplifier PGA may be designed to introduce negligible noise and negligible distortion into the signal. Otherwise, the analog-digital conversion carried out in the converter DCANPA may contain an error. In addition, for example, in continuous-time systems based on resistance ratios, the noise is a function of the value of the resistance. Consequently, the resistance value may be reduced to obtain a lower noise, which involves a great increase in power consumption.

SUMMARY OF THE INVENTION

One aspect is directed to a device comprising a programmable gain amplifier and an analog-digital converter with a pipeline architecture offering relaxed constraints on the noise and distortion compared to a typical programmable gain amplifier associated with this type of analog-digital converter. Another aspect is directed to an implementation substantially reducing the area occupied and the power consumption.

Another aspect is directed to combining the programmable gain amplifier with the pipeline-architecture analog-digital converter. And, when the analog-digital converter runs at the speed of a clock signal, the quantization and the amplification and attenuation may be carried out during one and the same period of the clock signal. Accordingly, the constraints on noise and distortion may be relaxed relative to a typical programmable gain amplifier placed outside the analog-digital converter. The quantization and the amplification and attenuation are advantageously controlled by external control signals obtained for the output signal of the analog-digital converter. Therefore, another aspect is directed to a device that may comprise a programmable gain amplifier and an analog-digital converter with a pipeline architecture comprising several stages.

According to a general feature of this aspect, the first stage of the analog-digital converter may incorporate the programmable gain amplifier and an analog-digital conversion circuit with a programmable threshold. It is therefore disclosed, for example, to modify the first stage of the analog-digital converter with a pipeline architecture so as to incorporate the programmable gain amplifier therein.

According to an embodiment, the programmable gain amplifier may comprise an amplifier, the output of which is looped back to a first input of this amplifier via a first switched capacitive circuit. This first switched capacitive circuit may comprise a first capacitive block and a second capacitive block of programmable capacitive value and may be coupled to the input of the first stage. Furthermore, the analog-digital conversion circuit with a programmable threshold may be coupled to the input of the first stage and may comprise programmable thresholding means or a programmable thresholding controller configured to define various programmable thresholds corresponding to the various programmable gains of the amplifier.

The second capacitive block may have a programmable capacitive value may comprise, for example, several capacitive branches in parallel, each capacitive branch comprising a capacitive network in series with a controllable switch. The programmable thresholding controller may comprise, for example, a programmable voltage divider bridge including a resistive network coupled to a reference voltage and to several selectively controllable switches.

According to another embodiment, the first stage of the analog-digital converter also may comprise a digital-analog conversion circuit coupled to the output of the analog-digital circuit, and configured to selectively deliver a voltage value taken from a set of reference values independent of the values of the programmable gains. The first stage of the converter also may comprise a second switched capacitive circuit, which is coupled to the output of the analog-digital circuit and of which the value is proportional, for example, equal in the case of a 1.5-bit stage to the capacitive value of the first capacitive block.

Such an embodiment may make it possible on the one hand not to program the set of reference values according to the programmable gains and to implement in a simple way the operation of subtraction carried out within the first stage. As indicated above, when the analog-digital conversion circuit of the first stage is a 1.5-bit circuit, the capacitive value of the second switched capacitive circuit, which is coupled to the output of the digital-analog conversion circuit, may be advantageously equal to the capacitive value of the first capacitive block. The device may also comprise control means or a controller configured to deliver control signals designed to program a gain value and a threshold value. The control means or the controller may be external to the analog-digital converter and may include a conventional digital feedback loop.

BRIEF DESCRIPTION OF THE DRAWINGS

Other advantages and features of the invention may appear on examining both the detailed description of embodiments and applications which are in no way limiting, and the appended drawings in which.

DETAILED DESCRIPTION OF THE PREFERRED EMBODIMENTS

Figure 3:
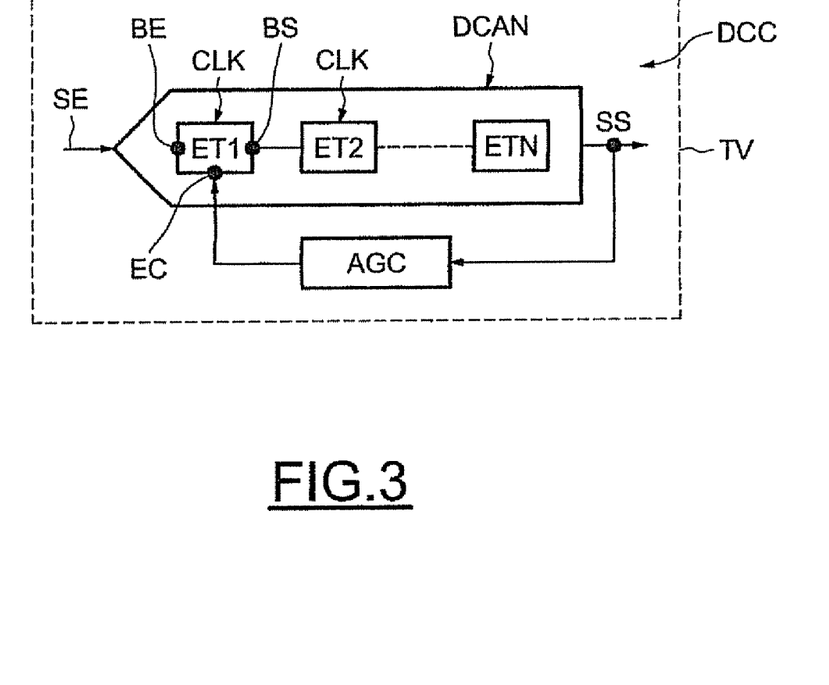
FIG. 3 is a schematic diagram of a circuit, according to the present invention.

In FIG. 3, the reference DCC indicates a device comprising an analog-digital converter DCAN of the type with a pipeline architecture, comprising several stages ET1, ..., ETN. The converter DCAN receives an analog signal SE and delivers a digital output signal SS. Furthermore, as may be seen in greater detail below, the first stage ET1 of the converter DCAN incorporates a programmable gain amplifier and an analog-digital circuit with a programmable threshold. Therefore, control means or a controller are advantageously provided that are capable of programming the values of gains and of the corresponding thresholds. The controller AGC is of the conventional type.

The stage ET1 comprises an input terminal BE, an output terminal BS, and one or more command inputs EC designed to receive the control signals delivered by the means AGC. Moreover, each stage runs at the speed of a clock signal CLK. Specifically, usually, if the stage of rank "i" runs at the speed of the clock signal CLK, the stage i+1 runs at the speed of the same clock signal CLK but using the opposite signal $\overline{CLK}$. The device DCC may be incorporated, for example, into a television set or a computer, when the signal SE may, for example, be a television signal.

Figure 4:
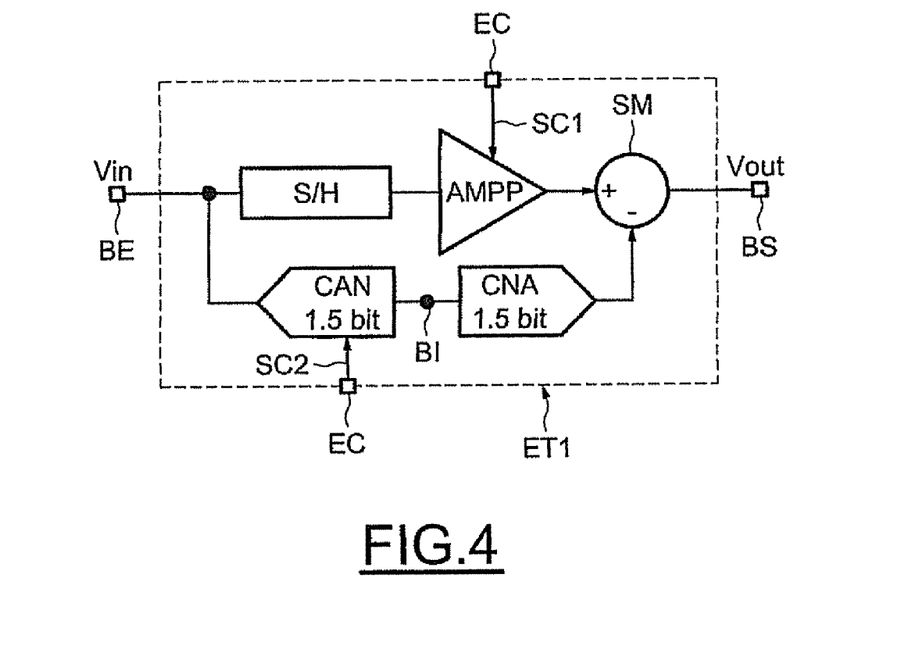
FIGS. 4 to 10 are more detailed schematic diagrams of examples of the embodiment and operation of the first stage of the analog-digital converter of the device of FIG. 3.

FIG. 4 illustrates in greater detail and still schematically the internal architecture of the first stage ET1 of the converter DCAN of FIG. 3. This first stage in this instance comprises a sample-and-hold unit S/H connected to the input terminal BE. Between this sample-and-hold unit S/H and the "+" input of a summer SM is a programmable gain amplifier AMPP configured to receive a control signal SC1 from the command input EC. This control signal SC1 is, as may be seen in greater detail below, designed to select a gain value from a set of possible values.

The first stage ET1 also comprises an analog-digital circuit CAN, the input of which is connected to the input terminal BE and the output of which BI delivers one or more bits (depending on the resolution of the analog-digital conversion stage). This analog-digital circuit has a programmable threshold and is designed to receive a control signal SC2 from the command input SC in order to select the comparison thresholds corresponding to the selected gain values. This analog-digital conversion stage CAN commands a digital-analog conversion stage CAN, the output of which is connected to the "−" input of the summer SM. The output of the summer SM is connected to the output BS of the stage ET1.

In the illustrative example described here, which is in no circumstances limiting, the first stage ET1 is a 1.5-bit stage, as it is typically called by those skilled in the art. More precisely, the output BI delivers two bits but, instead of these two bits defining four logical values, they define only three, namely the values 00, 01 and 10. This is why users speak of a 1.5-bit stage.

Figure 5:
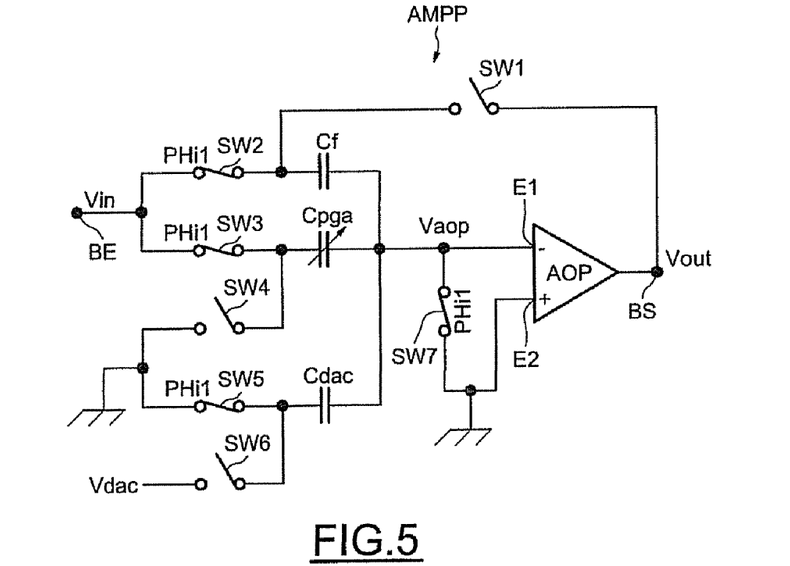

As illustrated in FIG. 5, the programmable gain amplifier AMPP comprises an amplifier AOP having a first input E1 (the "−" input) and a second input E2 (the "+" input). The input E2 is coupled to ground. The output BS of the amplifier AOP, which is in fact the output terminal BS of the stage ET1, is looped back to the input E1 via a first switched capacitive circuit. This first switched capacitive circuit comprises a first capacitive block, in this instance a capacitor Cf, and a second capacitive block with a programmable capacitive value Cpga.

The first switched capacitive circuit is coupled to the input terminal BE of the first stage via two switches SW2, SW3. The output BS of the amplifier AOP is connected to the first capacitive block Cf, between this first capacitive block CF and the switch SW2, via a switch SW1. Moreover, the other terminal of the first capacitive block Cf and the corresponding terminal of the capacitive block Cpga are connected together to the input E1 of the amplifier AOP. This input E1 is moreover also connected to ground via a switch SW7. The capacitive block Cpga is also connected to ground via a switch SW4.

In addition to this first switched capacitive circuit, formed of the two capacitive blocks Cf and Cpga in parallel, a second switched capacitive circuit Cdac is also provided connected to ground via a switch SW5 and moreover also connected to the input E1 of the amplifier AOP. Furthermore, the second switched capacitive circuit Cdac is capable of receiving a voltage Vdac originating, as may be seen in greater detail below, from the output of the digital-analog conversion circuit CAN via a switch SW6.

Figure 6:
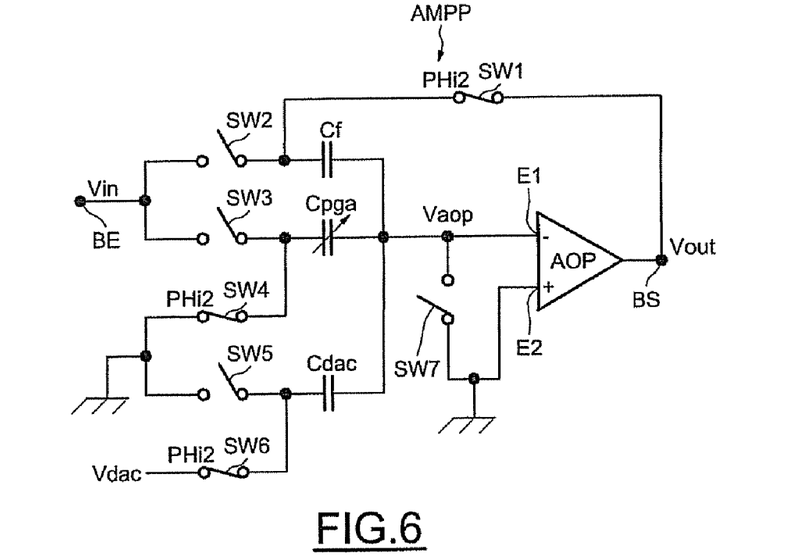
Figure 7:
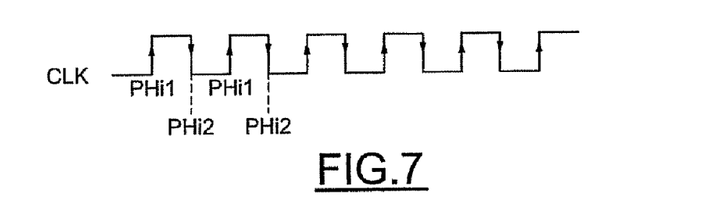

FIG. 5 illustrates the configuration of the switches in the sampling phase while FIG. 6 illustrates the configuration in the hold phase. In FIG. 5, the switches SW2, SW3, SW5 and SW7, controlled by the signal PHi1, are closed while the other switches SW1, SW4 and SW6 are open. Specifically, in this example, the signal PHi1 corresponds to the rising edges of the clock signal CLK (FIG. 7).

In FIG. 6, this time, it is the switches SW1, SW4, SW6 that are closed (signal PHi2 corresponding to the falling edge of the clock signal CLK) while the other switches are this time open. In the sampling phase, the capacitors Cf and Cpga are charged by the input voltage Vin while the capacitor Cdac is discharged. In the holding phase (FIG. 6), there is transfer of charge from the capacitors Cdac and Cpga to the capacitor Cf. Because of the charge-transfer equations, the output voltage Vout is defined by the formula (I) below:

$$Vout = Vin \cdot (Cf + Cpga)/Cf - Vdac \cdot Cdac/Cf \quad (I)$$

It can therefore be seen that the gain value of the amplifier is defined by the ratio (Cf+Cpga)/Cf while the capacitor Cdac makes it possible to carry out the subtraction of the voltage Vdac in the ratio Cdac/Cf. Taking a zero capacitive value for the capacitor Cpga, a gain of unity is obtained. Taking capacitors Cpga and Cf with identical capacitive values, a gain equal to 2 is obtained, while if a capacitor Cpga is taken whose capacitive value is equal to three times the capacitive value of the capacitor Cf, a gain of 4 is obtained.

Figure 8:
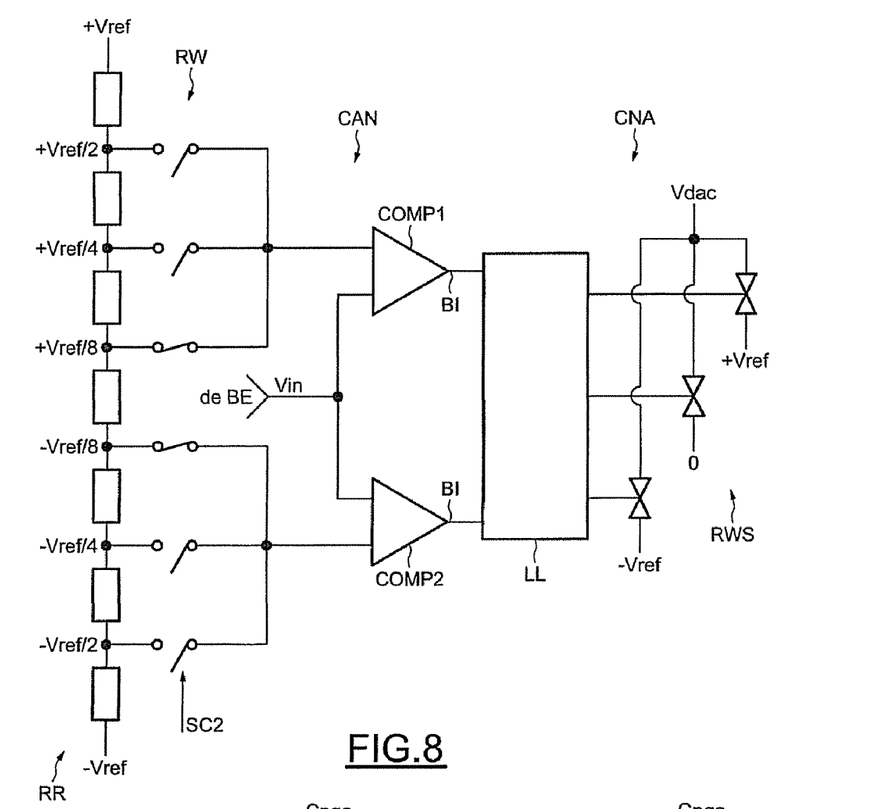

This being so, as illustrated in FIG. 8, the analog-digital conversion circuit CAN in this instance comprises two comparators COMP1 and COMP2, since it is a 1.5-bit analog-digital circuit (therefore delivering two bits). One of the inputs of each comparator is connected to the input terminal BE of the stage in order to receive the input voltage Vin. Moreover, the other comparator inputs are connected to programmable thresholding means or a programmable thresholding controller formed in this instance by a resistive network RR coupled to a reference voltage +Vref −Vref and to several switches RW that are selectively controllable by the control signal SC2. Therefore, depending on the gain of the amplifier, the value of the comparison thresholds may be adjusted.

More precisely, in the example described here, for a unitary gain of the amplifier, comparison thresholds equal to ±Vref/2 may be chosen. For a gain of the amplifier equal to 2, comparison thresholds equal to ±Vref/4 may be chosen, and while for a gain of the amplifier equal to 4, comparison thresholds equal to ±Vref/8 may be chosen. The digital-analog conversion circuit CNA comprises three switches RWS that can be commanded by a command logic LL controlled by the value of the two bits delivered by the two comparators COMP1 and COMP2. Therefore, as a function of the value of these two bits, the value of the voltage Vdac may be taken to be equal to −Vref, 0 or +Vref.

More precisely, for bit values of 00, that is to say for a voltage Vin that is lower than the negative value of the comparison threshold, the voltage Vdac may be equal to −Vref. For bit values equal to 01, that is to say for a voltage Vin of between the negative value and the positive value of the comparison threshold, Vdac may be equal to 0, and for bit values equal to 10, that is to say for a voltage Vin higher than the positive value of the comparison threshold, Vdac may be equal to +Vref.

Therefore, the comparison of the gain g of the amplifier (defined by the ratio (Cf+Cpga)/Cf) with the corresponding threshold makes it possible to obtain an amplifier having a corresponding overall gain G. More precisely, in the situation described here, with an amplifier gain g equal to 1, and comparison threshold values equal to ±Vref/2, an overall gain is obtained that is equal to ½, which corresponds to an attenuation of 6 dB and which is illustrated by the curve CV1 in the top portion of FIG. 9. If the gain g of the amplifier is taken to be equal to 2 in combination with comparison threshold values equal to ±Vref/4, an overall unitary amplification (G=1) is obtained, which is illustrated by the curve CV2 in the middle portion of FIG. 9.

Figure 9:
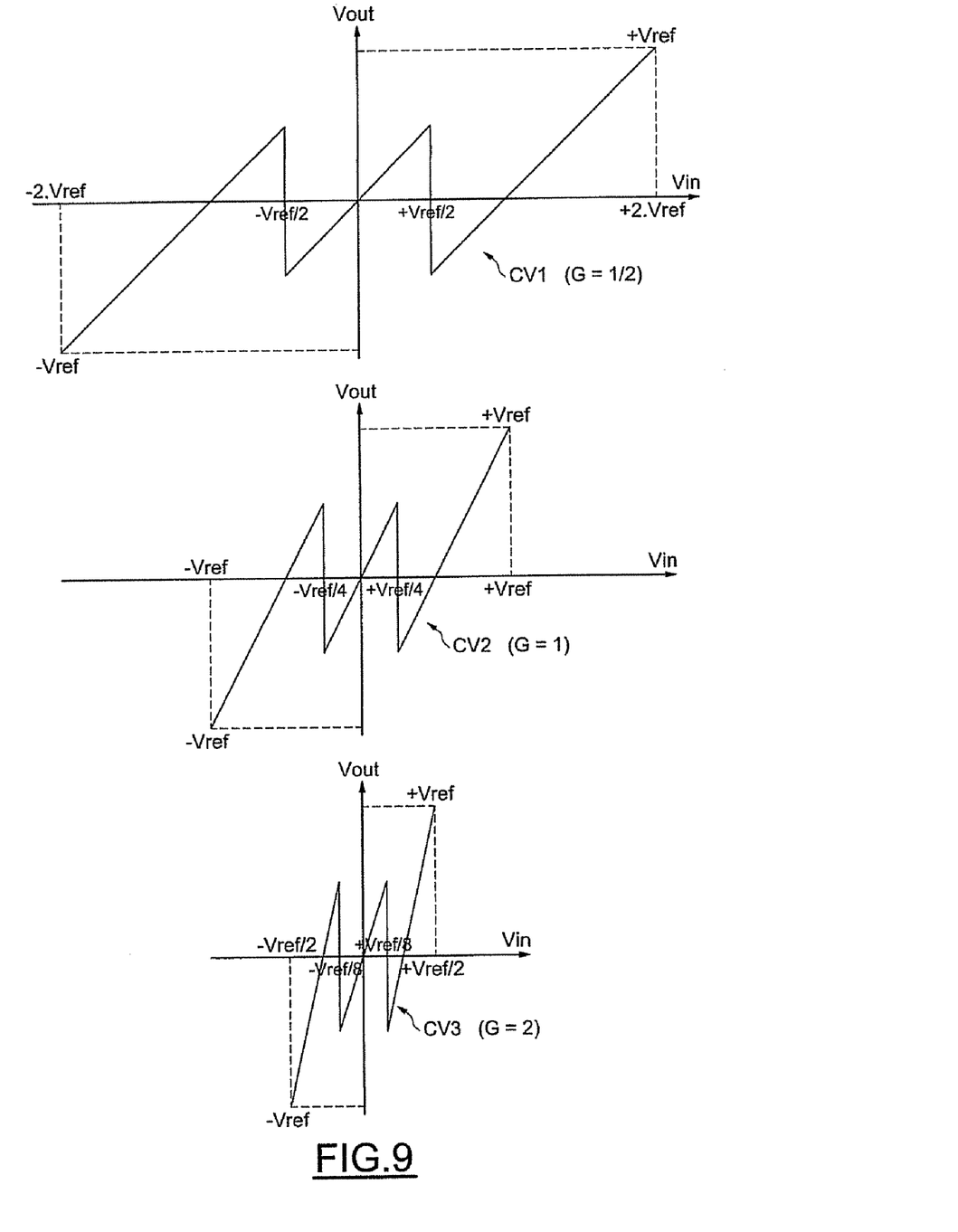

Finally, with an amplifier gain g equal to 4, and comparison thresholds equal to ±Vref/8, an overall gain amplification equal to 2 is obtained, which is illustrated by the curve CV3 in the bottom portion of FIG. 9. In the example that has been described, the capacitive values of the capacitors Cdac and Cf are equal. Whatever the gain value, it may be noted that the value Vdac is always taken to be equal to −Vref, 0 or +Vref.

Naturally, if the number of bits delivered by the analog-digital converter were greater than 2, the number of possible reference values for the value Vdac would be greater but always independent of the amplifier gain. For example, in the case of a 2.5-bit stage, the possible values for Vdac would be ±3Vref, ±2Vref, ±Vref and 0.

This being the case, in this precise situation, another method could comprise keeping the three values −Vref, 0, +Vref and delivering them selectively in an independent manner to the second switched capacitive circuit which would have, instead of a single capacitor Cdac having the capacitive value Cf, three capacitors, each having the capacitive value Cf. More precisely, in this case, either one capacitor would be connected to +Vref and the other two to the zero voltage (if it were desired to subtract Vref), or two capacitors to Vref and the third to the zero voltage (if it were desired to subtract 2Vref), or the three capacitors to Vref (if it were desired to subtract 3Vref), or one capacitor to −Vref and the other two to the zero voltage (if it were desired to add Vref), or two capacitors to −Vref and the third to the zero voltage (if it were desired to add 2Vref), or the three capacitors to −Vref (if it were desired to add 3Vref).

Figure 10:
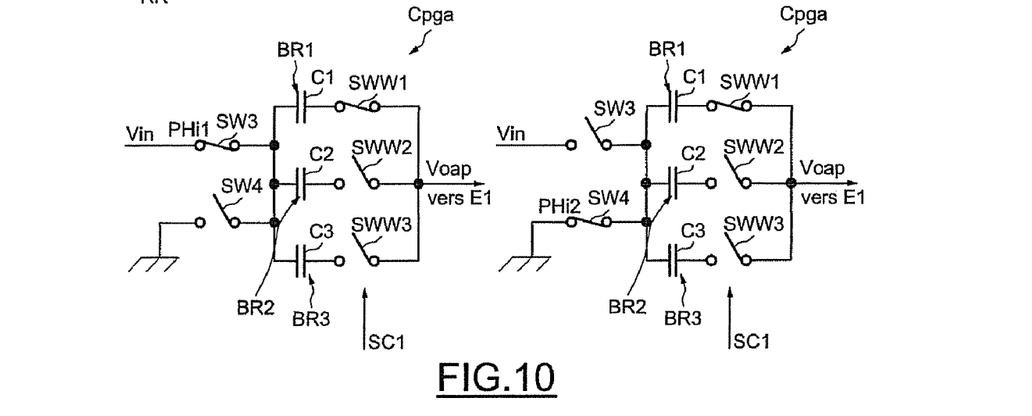

One way of producing the second capacitive block Cpga of programmable capacitive value is illustrated in FIG. 10. This capacitive block is in this instance produced by several capacitive branches BR1, BR2, BR3 in parallel (in this instance three branches are shown since the gain may be chosen from three different values).

Each branch comprises a capacitive network C1, C2, C3 in series with a controllable switch SWW1, SWW2, SWW3. These switches can be controlled by the control signal SC1. In the example that is described, the capacitive value of each of the capacitive networks C1, C2, C3 is equal to the capacitive value of the capacitor Cf, which allows the capacitive block Cpga to take the capacitive value zero, Cf or 3Cf, corresponding to the three envisaged gain values. In FIG. 10, the capacitive value of the capacitive block Cpga is equal to Cf (switch SWW1 closed and switches SWW2 and SWW3 open). If it is desired to obtain a zero capacitive value, all the switches SWWi are opened.

Figure 11:
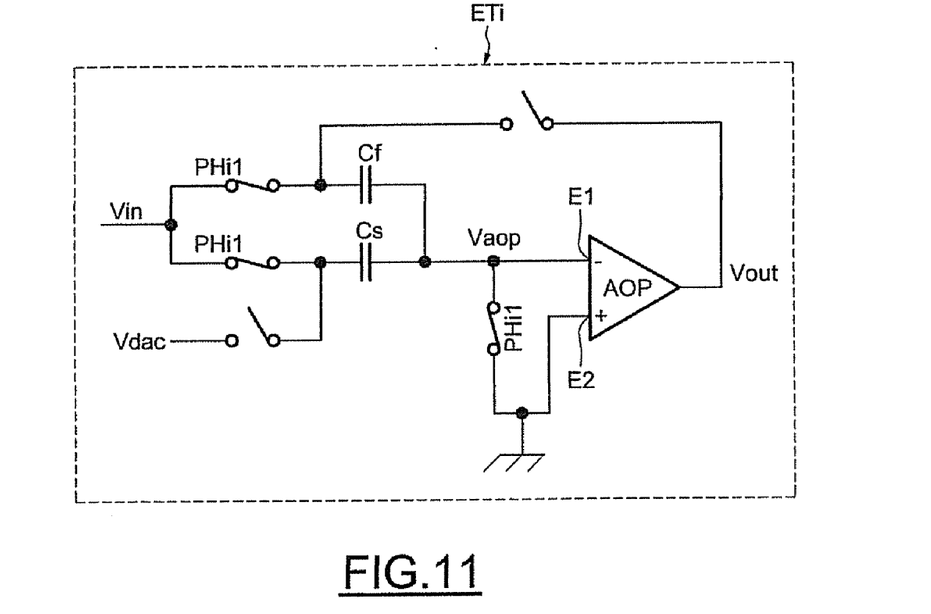
FIGS. 11 and 12 illustrate schematically examples of embodiment and of operation of a portion of another stage of the analog-digital converter of FIG. 3.
Figure 12:
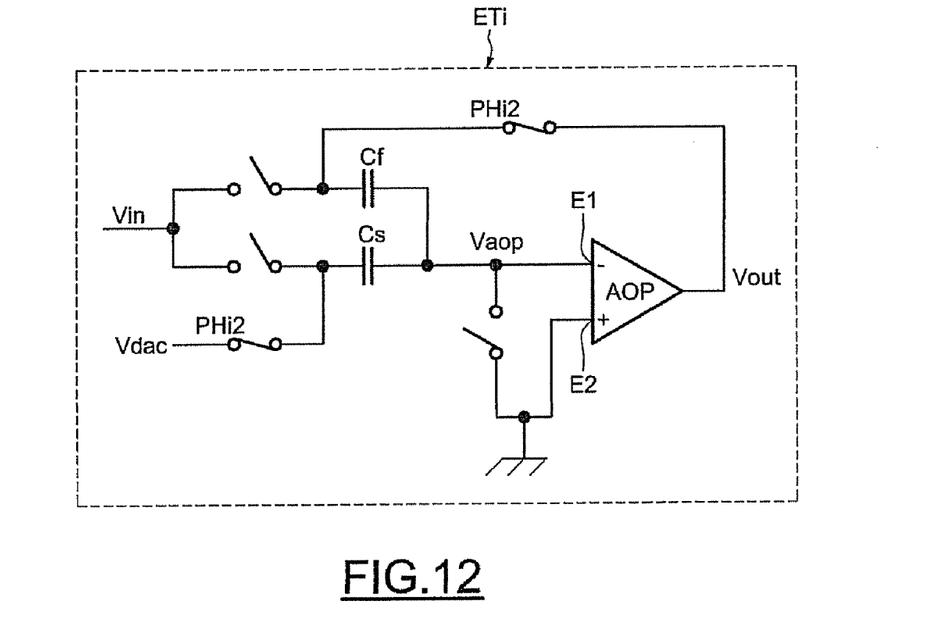

The left portion of FIG. 10 illustrates the configuration in the sampling phase while the right portion illustrates the configuration in the holding phase. Although it is possible to produce the other stages ETi of the analog-digital converter DCAN in a conventional manner, it is possible, as illustrated in FIG. 11, to use an architecture similar to that of the stage ET1, but this time with a fixed gain amplifier.

More precisely, the fixed gain amplifier comprises the amplifier AOP, the output of which is looped back to its first input E1 via a first auxiliary switched capacitive circuit, which comprises a first auxiliary capacitive block Cf and a second auxiliary capacitive block Cs. These two auxiliary capacitive blocks have fixed capacitive values, for example, equal in the case of a 1.5-bit stage so as to obtain a gain equal to 2.

Here again, this first auxiliary switched capacitive circuit Cf, Cs is coupled to the input of the stage ETi. Moreover, the analog-digital conversion circuit has a fixed threshold, corresponding to the gain of the fixed gain amplifier. Therefore, for a gain equal to 2, the user may choose thresholds equal to ±Vref/4 leading to an overall unitary amplification. The digital-analog conversion circuit is coupled between the output of the analog-digital circuit and the second auxiliary capacitive block, more precisely at the capacitor Cs, which again makes it possible to very simply implement the subtraction function of the stage.

The architecture of the circuits that have been described is a single-ended architecture, as recognized by those skilled in the art. This being the case, the present disclosure may apply to a differential architecture. Similarly, the three overall gains specified above (G=½, 1 or 2) are only non-limiting examples, since the present disclosure can be generalized to any number of overall gains, for example, 32.

That which is claimed:
1. A device comprising:
  an analog-digital converter for an analog input signal and with a pipeline architecture comprising a sequence of stages, an initial first stage of said sequence comprising a programmable gain amplifier,
  an analog-to-digital conversion circuit with a programmable range threshold and being coupled to said programmable gain amplifier, said analog-to-digital conversion circuit configured to convert the analog input signal, a digital-to-analog conversion circuit being coupled to an output of said analog-to-digital conversion circuit, and a sample-and-hold circuit coupled between said programmable gain amplifier and said analog-to-digital conversion circuit, and configured to sample-and-hold the analog input signal.

2. The device according to claim 1 wherein said programmable gain amplifier comprises:

an amplifier; and a first switched capacitive circuit for coupling said amplifier in feedback, said first switched capacitive circuit comprising a first capacitive block, and a second capacitive block of programmable capacitance coupled thereto; said first switched capacitive circuit being coupled to an input of the initial first stage; said analog-to-digital conversion circuit being coupled to the input of the initial first stage and comprising a programmable range threshold controller configured to define a plurality of range thresholds corresponding to a plurality of gains of said amplifier.

3. The device according to claim 2 wherein said second capacitive block comprises a plurality of capacitive branches coupled in parallel, each capacitive branch comprising a capacitor in series with a switch.

4. The device according to claim 2 wherein said programmable range threshold controller comprises:

a voltage divider bridge including a resistor network coupled to a reference voltage; and a plurality of switches coupled to said voltage divider bridge.

5. The device according to claim 2 wherein said digital-to-analog conversion circuit is configured to selectively deliver a voltage value from a set of reference values independent of values of the plurality of gains; and wherein the initial first stage of said analog-digital converter further comprises a second switched capacitive circuit being coupled to an output of said digital-to-analog conversion circuit and having a capacitive value proportional to the capacitive value of said first capacitive block.

6. The device according to claim 5 wherein said analog-to-digital conversion circuit comprises a 1.5-bit circuit; and wherein said second switched capacitive circuit has a capacitive value equal to the capacitive value of said first capacitive block.

7. The device according to claim 1 further comprising a controller configured to deliver control signals for a gain value and a corresponding range threshold value.

8. The device according to claim 1 wherein each stage from said analog-digital converter other than the initial first stage comprises:

an amplifier with a fixed gain;

a first auxiliary switched capacitive circuit for coupling said amplifier in feedback, said first auxiliary switched capacitive circuit comprising a first capacitive block, and a second auxiliary capacitor;

said first auxiliary switched capacitive circuit being coupled to an input of another stage in said analog-digital converter;

an analog-to-digital conversion circuit with fixed range thresholds corresponding to the fixed gain of said amplifier; and a digital-to-analog conversion circuit being coupled between an output of said analog-to-digital circuit and said second auxiliary capacitor.

9. A device comprising:

an analog-digital converter for an analog input signal and with a pipeline architecture comprising a sequence of stages, an initial first stage of said sequence comprising a programmable gain amplifier comprising an amplifier, and a first switched capacitive circuit for coupling said amplifier in feedback, said first switched capacitive circuit comprising a first capacitive block, and a second capacitive block of programmable capacitance coupled thereto, an analog-to-digital conversion circuit with a programmable range threshold and being coupled to said programmable gain amplifier and comprising a programmable range threshold controller configured to define a plurality of range thresholds corresponding to a plurality of gains of said amplifier, said analog-to-digital conversion circuit configured to convert the analog input signal, a digital-to-analog conversion circuit being coupled to an output of said analog-to-digital conversion circuit, and a sample-and-hold circuit coupled between said programmable gain amplifier and said analog-to-digital conversion circuit, and configured to sample-and-hold the analog input signal; and a controller configured to deliver control signals to the initial first stage for a gain value and a corresponding range threshold value.

10. The device according to claim 9 wherein said second capacitive block comprises a plurality of capacitive branches coupled in parallel, each capacitive branch comprising a capacitor in series with a switch.

11. The device according to claim 9 wherein said programmable range threshold controller comprises:

a voltage divider bridge including a resistor network coupled to a reference voltage; and a plurality of switches coupled to said voltage divider bridge.

12. The device according to claim 9 wherein said digital-to-analog conversion circuit is configured to selectively deliver a voltage value from a set of reference values independent of values of the plurality of programmable gains; and wherein the initial first stage of said analog-digital converter further comprises a second switched capacitive circuit being coupled to an output of said digital-to-analog conversion circuit and having a capacitive value proportional to the capacitive value of said first capacitive block.

13. The device according to claim 12 wherein said analog-to-digital conversion circuit is a 1.5-bit circuit; and wherein said second switched capacitive circuit has a capacitive value equal to the capacitive value of said first capacitive block.

14. The device according to claim 9 wherein each stage from said analog-digital converter other than the initial first stage comprises:

an amplifier with a fixed gain;

a first auxiliary switched capacitive circuit for coupling said amplifier in feedback, said first auxiliary switched capacitive circuit comprising a first capacitive block, and a second auxiliary capacitor;

said first auxiliary switched capacitive circuit being coupled to an input of another stage in said analog-digital converter;

an analog-to-digital conversion circuit with fixed range thresholds corresponding to the fixed gain of said amplifier; and a digital-to-analog conversion circuit being coupled between an output of said analog-to-digital circuit and said second auxiliary capacitor.

15. A method of operating a device comprising an analog-digital converter for an analog input signal and with a pipeline architecture comprising a sequence of stages, e an initial first stage of the sequence comprising a programmable gain amplifier, an analog-to-digital conversion circuit with a programmable range threshold and being coupled to the programmable gain amplifier, the analog-to-digital conversion circuit converting the analog input signal, a digital-to-analog conversion circuit being coupled to an output of the analog-to-digital conversion circuit, and a sample-and-hold circuit coupled between the programmable gain amplifier and the analog-to-digital conversion circuit and sample-and-holding the analog input signal, the method comprising:
processing an analog signal with the device;
operating each stage at a speed of a clock signal; and
within each period of the clock signal, carrying out amplification and quantization of the analog signal in the initial first stage.

16. The method according to claim 15 wherein the programmable gain amplifier comprises:
an amplifier; and
a first switched capacitive circuit for coupling the amplifier in feedback, the first switched capacitive circuit comprising a first capacitive block, and a second capacitive block of programmable capacitance coupled thereto; the first switched capacitive circuit being coupled to an input of the initial first stage; the analog-to-digital conversion circuit being coupled to the input of the initial first stage and comprising a programmable range threshold controller configured to define a plurality of range thresholds corresponding to a plurality of gains of the amplifier.

17. The method according to claim 16 wherein the second capacitive block comprises a plurality of capacitive branches coupled in parallel, each capacitive branch comprising a capacitor in series with a switch.

18. The method according to claim 16 wherein the programmable range threshold controller comprises:
a voltage divider bridge including a resistor network coupled to a reference voltage; and
a plurality of switches coupled to the voltage divider bridge.

19. The method according to claim 16 wherein the digital-to-analog conversion circuit is configured to selectively deliver a voltage value from a set of reference values independent of values of the plurality of programmable gains; and wherein the initial first stage of the analog-digital converter further comprises a second switched capacitive circuit being coupled to an output of the digital-to-analog conversion circuit and having a capacitive value proportional to the capacitive value of the first capacitive block.

20. The method according to claim 19 wherein the analog-to-digital conversion circuit is a 1.5-bit circuit; and wherein the second switched capacitive circuit has a capacitive value equal to the capacitive value of the first capacitive block.

21. The method according to claim 15 further comprising delivering control signals for a gain value and a corresponding range threshold value.

22. The method according to claim 15 wherein each stage from the analog-digital converter other than the initial first stage comprises:
an amplifier with a fixed gain;
a first auxiliary switched capacitive circuit for coupling the amplifier in feedback, the first auxiliary switched capacitive circuit comprising a first capacitive block, and a second auxiliary capacitor;
the first auxiliary switched capacitive circuit being coupled to an input of another stage in the analog-digital converter;
an analog-to-digital conversion circuit with fixed range thresholds corresponding to the fixed gain of the amplifier; and
a digital-to-analog conversion circuit being coupled between an output of the analog-to-digital circuit and the second auxiliary capacitive block.

23. A method of making a device comprising:
providing an analog-digital converter for an analog input signal and with a pipeline architecture comprising a sequence of stages; and
forming an initial first stage of the analog-digital converter to comprise
a programmable gain amplifier,
an analog-to-digital conversion circuit with a programmable range threshold and being coupled to the programmable gain amplifier, the analog-to-digital conversion circuit converting the analog input signal,
a digital-to-analog conversion circuit being coupled to an output of the analog-to-digital conversion circuit, and
a sample-and-hold circuit coupled between the programmable gain amplifier and the analog-to-digital conversion circuit, and sample-and-holding the analog input signal.

24. The method according to claim 23 wherein forming the programmable gain amplifier comprises:
coupling an amplifier in feedback with a first switched capacitive circuit in feedback, the first switched capacitive circuit comprising a first capacitive block, and a second capacitive block of programmable capacitance coupled thereto;
coupling the first switched capacitive circuit to an input of the initial first stage;
coupling the analog-to-digital conversion circuit to the input of the initial first stage, the analog-to-digital conversion circuit comprising a programmable range threshold controller configured to define a plurality of range thresholds corresponding to a plurality of gains of the amplifier.

25. The method according to claim 24 wherein the second capacitive block comprises a plurality of capacitive branches coupled in parallel, each capacitive branch comprising a capacitor in series with a switch.

26. The method according to claim 24 wherein the programmable range threshold controller comprises:
a voltage divider bridge including a resistor network coupled to a reference voltage; and
a plurality of switches coupled to the voltage divider bridge.

* * * * *

UNITED STATES PATENT AND TRADEMARK OFFICE
CERTIFICATE OF CORRECTION

PATENT NO.       : 8,274,419 B2  
APPLICATION NO.  : 12/702970  
DATED            : September 25, 2012  
INVENTOR(S)      : Hugo Gicquel, Sophie Minot and Marc Sabut Page 1 of 1

It is certified that error appears in the above-identified patent and that said Letters Patent is hereby corrected as shown below:

In the Claims:

Column 9, Line 6    Delete: "stages, e an initial"  
                    Insert: -- stages, an initial --

Signed and Sealed this  
Fourteenth Day of May, 2013

Teresa Stanek Rea  
*Acting Director of the United States Patent and Trademark Office*